United States Patent [19]

Bete

[11] 4,445,055
[45] Apr. 24, 1984

[54] CIRCUIT ARRANGEMENT FOR CONTROLLING A POWER FIELD-EFFECT SWITCHING TRANSISTOR

[75] Inventor: Manfred Bete, Erlangen, Fed. Rep. of Germany

[73] Assignee: Siemens Aktiengesellschaft, Munich, Fed. Rep. of Germany

[21] Appl. No.: 351,150

[22] Filed: Feb. 22, 1982

[30] Foreign Application Priority Data

Mar. 5, 1981 [DE] Fed. Rep. of Germany ....... 3108385

[51] Int. Cl.³ .......................................... H03K 17/687
[52] U.S. Cl. .................................... 307/571; 307/573; 307/574
[58] Field of Search ................. 307/246, 584, 571–579, 307/581, 585

[56] References Cited

U.S. PATENT DOCUMENTS

| 3,558,921 | 1/1971 | Yokozawa | 307/570 |
| 4,387,308 | 6/1983 | Nagami | 307/584 |

FOREIGN PATENT DOCUMENTS 56-31227  3/1981  Japan ................................ 307/571

OTHER PUBLICATIONS

*Rev. Sci. Instrum.*, vol. 46, No. 8, Aug. 1975, "Design of a Simple and Inexpensive Analog Gate", H. Rosen et al., pp. 1115 and 1116.

*Primary Examiner*—Stanley D. Miller
*Assistant Examiner*—B. P. Davis
*Attorney, Agent, or Firm*—Kenyon & Kenyon

[57] ABSTRACT

A power field-effect switching transistor is switched-on by charging its gate-source capacitance by connecting a capacitor thereto by means of a first transistor. Switching-off of the power field-effect switching transistor is achieved by discharging the gate-source capacitance by switching-on a second transistor. In this manner, the charging and discharging processes take place at low resistance, and therefore in a short period of time. As a result, switching times and switching power losses for the power field-effect switching transistor are minimized. In addition, the need for a separate auxiliary voltage source and inductive circuit elements is obviated.

9 Claims, 2 Drawing Figures

4,445,055

CIRCUIT ARRANGEMENT FOR CONTROLLING A POWER FIELD-EFFECT SWITCHING TRANSISTOR

BACKGROUND OF THE INVENTION

This invention relates generally to systems for controlling power transistors, and more particularly, to a method and circuit arrangement for controlling the conductive and nonconductive states of power field-effect switching transistors.

It is known that the time required during the switching of a field-effect transistor between its conductive and nonconductive states is determined by the charging and discharging time of the gate-source capacitance of the FET. Such a gate-source capacitance, particularly in power FET's, assumes considerable values. It is also known that power dissipation by a transistor during switching operations is minimized by reducing the switching times to as short a duration as possible. Short switching times have been achieved by utilizing driving circuits which supply relatively large pulse currents. Thus, commercially available drive circuits achieve the desired large pulse currents by utilizing separate auxiliary voltage sources. Such auxiliary voltage sources, however, are relatively expensive.

It is, therefore, an object of this invention to provide a method for driving a power field-effect switching transistor by the use of large pulse currents, without the need for separate auxiliary voltage sources.

It is a further object of this invention to provide drive circuitry for controlling the switching between conductive and nonconductive states of a power field-effect switching transistor by supplying large pulse currents thereto, without requiring separate auxiliary voltage sources.

SUMMARY OF THE INVENTION

The foregoing and other objects are achieved by this invention which provides a system for switching-on a power field-effect switching transistor by utilizing the combination of a capacitor and a first transistor to charge the gate-source capacitance of the power field-effect switching transistor. Switching-off of the power field-effect switching transistor is achieved by switching-on a second transistor through which the gate-source capacitance is discharged.

The inventive techniques of charging the gate-source capacitance of a FET by means of a capacitor, and discharging the gate-source capacitance directly through a second transistor permit large pulse currents to be generated without the need for separate auxiliary voltage sources. Moreover, the need for expensive inductive components is obviated.

In a specific illustrative circuit embodiment of the invention which implements the inventive method, a first input terminal is coupled by means of the drain-source path of a N-channel field-effect switching transistor to a first output terminal; the power FET being driven by a drive transistor. A second input terminal is connected directly to a second output terminal. The drain-source path of the power field-effect switching transistor is advantageously shunted by the series combination of a diode which has its anode terminal coupled to the first input terminal (positive pole of the supply voltage), and a capacitor. The junction node of the diode and the capacitor is connected by means of the switching path of an auxiliary transistor to the gate of the power field-effect switching transistor. A resistor couples the control terminal of the auxiliary transistor to the junction node of the diode and the capacitor. Moreover, the control terminal of the auxiliary transistor is connected by means of the switching path of a drive transistor to the second input terminal. A resistor is interposed between the control terminal of the auxiliary transistor and the junction point of the control path of the auxiliary transistor with the gate of the power field-effect switching transistor. Such a simple circuit arrangement permits the implementation of the inventive method for controlling power field-effect switching transistors of the N-channel type.

In a further circuit embodiment of the invention which is useful for controlling the switching of a power field-effect switching transistor of the P-channel type, a first input terminal is connected by means of the drain-source path of a power field-effect switching transistor to a first output terminal, and a second input terminal is coupled directly to a second output terminal. In one embodiment, the gate electrode of the power field-effect switching transistor is coupled to the source electrode of the same transistor by a series circuit containing the parallel combination of the capacitor and resistor in series with the source drain path of an auxiliary transistor. The junction node of the capacitor and the auxiliary transistor is coupled to the second input terminal and the drain-source path of a drive transistor. A junction node intermediate of the diode and the switching path of the drive transistor is coupled to the control terminal of the auxiliary transistor and, by means of a resistor, to the first input terminal. Such a simple circuit arrangement permits the implementation of the inventive method for controlling a power field-effect switching transistor of the P-channel type.

In one embodiment, the auxiliary and drive transistors are advantageously selected to be field-effect transistors. Such field-effect transistors have the advantage of requiring only small amounts of drive power.

The gate-source paths of the power field-effect switching transistor and the auxiliary transistor are each shunted by respective zener diodes. Such zener diodes prevent the gate-source paths from being damaged by over voltages. Also, zener diodes may be used in circuit arrangements for P-channel type power field-effect switching transistors.

In a further embodiment, a resistor is advantageously interposed in series with the switching path of the auxiliary transistor. Such a resistor protects the auxiliary transistor from damage resulting from over current during the charging and discharging of the gate-source capacitance of the power field-effect switching transistor.

BRIEF DESCRIPTION OF THE DRAWINGS

Comprehension of the invention is facilitated by reading the following detailed description in conjunction with the annexed drawings, in which.

DETAILED DESCRIPTION

Figure 1:
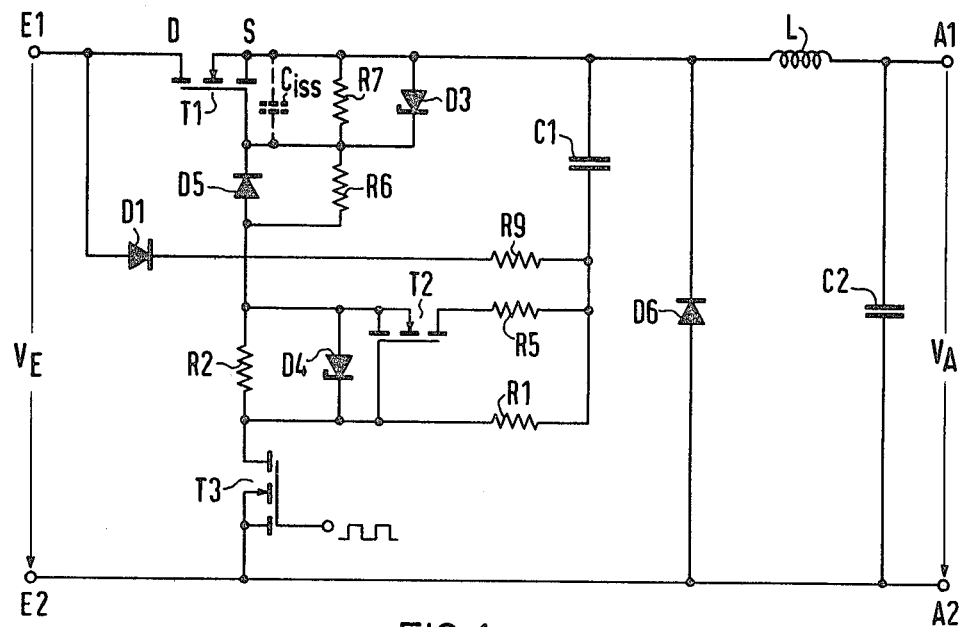
FIG. 1 is a schematic representation of a circuit arrangement which is configured to implement the inventive method by controlling a N-channel power field-effect switching transistor.

FIG. 1 shows a drive circuit for a power field-effect switching transistor T1 of the N-channel type. In this embodiment, a field-effect transistor of the enhancement type is used as power field-effect switching transistor T1 (hereinafter "PFEST T1"). As shown in FIG. 1, N-channel type PFEST T1 interconnects input terminal E1 with output terminal A1 by means of an inductor L. A second input terminal E2 is connected directly to a second output terminal A2. Output terminals A1 and A2 are connected to one another by a filter capacitor C2. In addition, a bypass diode D6 has its anode connected to output terminal A2 and its cathode connected to the junction conductor intermediate of PFEST T1 and choke L. A supply voltage $V_E$ is applied at input terminals E1 and E2, input terminal E1 having a positive polarity with respect to input terminal E2. The output voltage present across output terminals A1 and A2 can be advantageously adjusted by addressing PFEST T1 periodically so as to change its duty cycle. During the periods of time that PFEST T1 is nonconductive, the flow of current through inductor L flows through bypass diode D6.

The gate electrode of PFEST T1 is connected to input terminal E2 by means of a series circuit consisting of a diode D5, a resistor R2, and the drain-source path of a driving field-effect transistor T3 (hereinafter "FET T3"). The cathode terminal of diode D5 is connected to the gate electrode of PFEST T1. A parallel circuit arrangement consisting of resistor R7 and a zener diode D3 is connected in shunt across the gate-source path of PFEST T1. Zener diode D3 is coupled at its anode terminal to the source terminal of PFEST T1, and resistor R6 shunts diode D5.

The drain-source path of PFEST T1 is shunted by a series circuit consisting of a diode D1, a resistor R9, and a capacitor C1. In this arrangement, the anode terminal of diode D1 is connected to the drain terminal of PFEST T1. A resistor R5 is connected at one end to the junction node of resistor R9 and capacitor C1, and at its other end to the drain-source path of an auxiliary field-effect transistor T2 (hereinafter "FET T2"). The source terminal of FET T2 is connected to the junction node of resistor R2 and the anode terminal of diode D5. Auxiliary FET T2 is connected at its gate terminal to the drain terminal of a driver FET T3, and, by means of resistor R1, to the junction node of resistor R9 and capacitor C1. In this embodiment, the gate-source path of auxiliary FET T2 is shunted by a zener diode D4 which is connected at its anode to the source terminal of auxiliary FET T2.

In the course of a cycle period, the drive circuit of FIG. 1 operates as follows: assuming that driver FET T3 is in a conductive state, PFEST T1 is nonconductive because its gate electrode is at a zero potential by means of resistors R6 and R2, as well as the drain-source path of driver FET T3. During the period of time that PFEST T1 is in a nonconductive state, nearly the full input voltage is present across the series circuit of diode D1, resistor R9, and capacitor C1, because bypass diode D6 is conducting heavily and its cathode terminal is nearly at zero potential. Capacitor C1 is therefore charged to a voltage corresponding to $V_E \times R1/(R1+R9)$, the voltage being provided by voltage divider resistors R9 and R1. Resistor R9 prevents damage to D1 which may result from excessive charging currents.

In order to switch PFEST T1 into a conductive state, driver FET T3 is cut-off. In this manner, the voltage at the drain terminal of driver FET T3 and the gate voltage of auxiliary FET T2 is raised, by operation of relatively high value resistor R1, so that auxiliary FET T2 becomes conductive. An internal gate-source capacitor $C_{iss}$ of PFEST T1, capacitor $C_{iss}$ being shown in dashed phantom in FIG. 1, is charged by capacitor C1 via resistor R5 and auxiliary FET T2, as well as diode D5. This causes PFEST T1 to conduct. Resistor R5 has a relatively low resistance value and limits the magnitude of the charging current.

In accordance with the foregoing, the switching-on process of PFEST T1 is very short, and power losses during the switching-on remain small. In this arrangement, the switching times of driving FET T3 and auxiliary FET T2 can be neglected as being small relative to the switching time of PFEST T1, because the gate-source capacitance of these FET's is small in view of their small power handling capacity.

During the transition into the conductive state, the voltage at the source electrode of PFEST T1, and consequently the voltage at the junction node between capacitor C1 and resistor R5 rise above the level of the input voltage. Thus, PFEST T1 is maintained in the conductive state.

If it is now desired to switch PFEST T1 into the nonconductive state, driver FET T3 is switched into the conductive state. This causes gate-source capacitor $C_{iss}$ of PFEST T1 to be discharged through resistor R6, the parallel combination of resistor R2 and zener diode D4, and the drain-source path of driver FET T3. Resistor R6 serves to limit the discharge current, but has a sufficently low resistance value to achieve a fast discharging process. Thus, the switching-off time of PFEST T1 is short, and the switching-off losses remain low.

Zener diodes D3 and D4 limit the gate-source voltages of PFEST T1 and auxiliary FET T2 to permissible values. Diode D1 prevents the discharging of capacitor C1 via resistor R9 during the period that PFEST T1 is conductive. Capacitor $C_{iss}$ can be charged via zener diode D3 and resistor R7 if the load current is zero.

Figure 2:
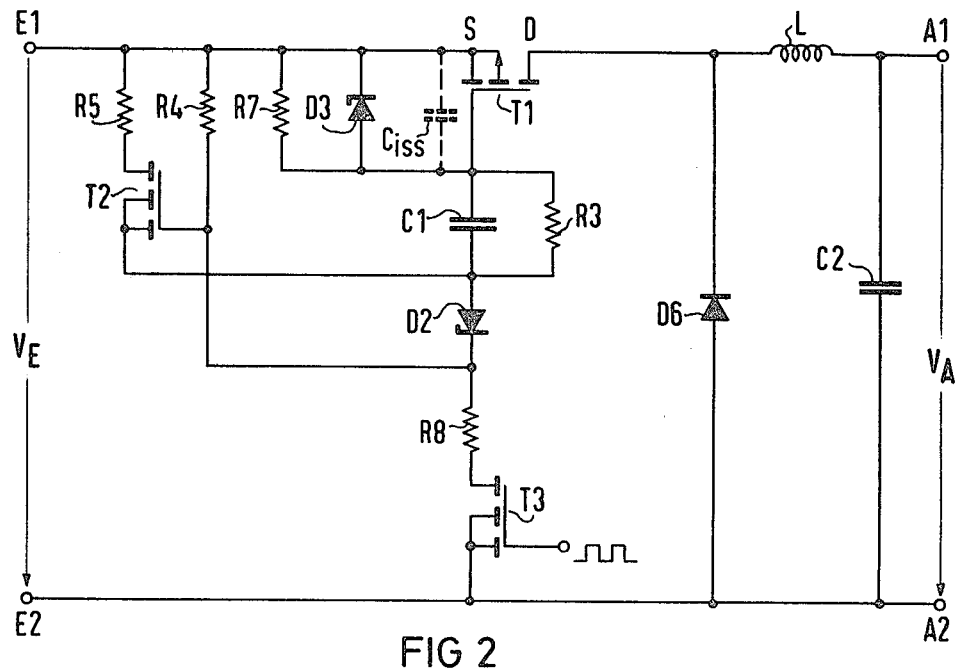
FIG. 2 is a schematic representation of a circuit arrangement for implementing the inventive method and controlling a power field-effect switching transistor of the P-channel type.

FIG. 2 is a schematic representation of a circuit arrangement wherein components having analogy to components in the embodiment of FIG. 1 are similarly designated. This circuit is adapted to control the conductive state of a P-channel PFEST T1. In this embodiment, the gate terminal of PFEST T1 is connected via a series circuit consisting of capacitor C1, zener diode D2, resistor R8, and the drain-source path of a driver FET T3, to the reference potential of the circuit. Capacitor C1 is shunted by a resistor R3.

The junction point of capacitor C1 and zener diode D2 is connected through the drain-source path of auxiliary FET T2 and a resistor R5 to input terminal E1, where a positive supply voltage is present. The gate terminal of auxiliary FET T2 is connected directly to a junction node between zener diode D2 and resistor R8, and via resistor R4 to input terminal E1. The parallel combination of resistor R7 and zener diode D3, the cathode of which is connected to the source terminal of PFEST T1, is connected between the source and gate terminals of PFEST T1.

Assuming that driver FET T3 is in a conductive state, a drive current flows through gate-source capacitor $C_{iss}$ of PFEST T1, capacitor C1, zener diode D2, resistor R8, and the drain-source path of driver FET T3. In this manner, gate-source capacitor $C_{iss}$ of PFEST T1 and capacitor C1 are charged, resistor R8 serving to limit the current. The value of resistor R3 determines the maximum value of the charging voltage across capacitor C1. During the time that PFEST T1 is conductive, auxiliary FET T2 is cut-off since a current flows through zener diode D2.

P-channel type PFEST T2 can be cut-off by switching-off driver FET T3. This causes the gate-source voltage to be raised by operation of resistor R4 until auxiliary FET T2 becomes conductive. In this manner, the gate-source capacitor $C_{iss}$ of PFEST T1, and capacitor C1, can be discharged via the drain-source path of auxiliary FET T2 and resistor R5. The voltage at the gate electrode of PFEST T1, when capacitor C1 is charged, is higher than the voltage of the source electrode by the diode threshold voltage of zener diode D3. Resistor R5 limits the discharge current, but has a very small resistance value so that discharging process occurs quickly. Thus, PFEST T1 is cut-off after a very short time thereby minimizing switching-off power losses.

Zener diodes D2 and D3 limit the gate-source voltages of auxiliary FET T2 and PFEST T1, respectively, to permissible values.

It is therefore evident that PFEST's of the N-channel type, and the P-channel type, can be driven by the described low resistance circuits, to effect rapid charging and discharging of the gate-source capacitor of the PFEST. Accordingly, the switching times and the switching power losses are kept to a minimum, and separate auxiliary voltage sources are not required. Moreover, the inventive method and circuitry utilizes capacitive elements which are substantially more cost-effective than inductive elements.

Although the invention has been described in terms of specific embodiments for specific applications, it is to be understood that persons skilled in the art, in light of this teaching, can produce additional embodiments without departing from the spirit or exceeding the scope of the claimed invention. Accordingly, it is to be understood that the drawings and descriptions in this disclosure are proffered to facilitate comprehension of the invention and should not be construed to limit the scope thereof.

What is claimed is:

1. A circuit arrangement for driving an N-channel type power field-effect switching transistor, the arrangement having a first input terminal connected via the drain-source path of the N-channel type power field-effect switching transistor to a first output terminal, the circuit arrangement further having a second input terminal connected to a second output terminal, the arrangement comprising:

series circuit means connected in shunt across the drain-source path of the N-channel type power field-effect switching transistor, said series circuit means having a diode, said diode having anode and cathode terminals and being connected in series with a capacitor, said anode terminal of said diode being connected to a first input terminal of the circuit arrangement, said first input terminal being adapted for receiving a voltage of positive polarity with respect to a second input terminal of the circuit arrangement;

auxiliary transistor means for interconnecting a junction node between said diode and said capacitor to a gate electrode of the N-channel type power field-effect switching transistor;

first resistor means for connecting a control terminal of said auxiliary transistor means to said junction node between said diode and said capacitor;

driver transistor means for connecting said control terminal of said auxiliary transistor means to said second input terminal of the circuit arrangement; and second resistor means for connecting said control terminal of said auxiliary transistor means to a junction node of a control path of said auxiliary transistor means with the gate terminal of the N-channel type power field-effect switching transistor.

2. A circuit arrangement for driving a P-channel type power field-effect switching transistor, the circuit arrangement having a first input terminal connected through a drain-source path of the P-channel type power field-effect switching transistor, the circuit arrangement further having a second input terminal connected to a second output terminal, the circuit arrangement comprising:

circuit means having a capacitor connected in shunt with a resistor;

auxiliary transistor means connected in a series arrangement with said circuit means, said series circuit arrangement being connected in shunt across the source and gate terminals of the P-channel type power field-effect switching transistor, said capacitor being connected to the gate terminal of the P-channel type power field-effect switching transistor;

coupling means having a diode and driver transistor means for connecting said auxiliary transistor means to the second input terminal; and means for connecting a control terminal of said auxiliary transistor means to a junction node between said diode and said driver transistor, and through a resistor to the first input terminal.

3. The circuit arrangement of claims 1 or 2 wherein said auxiliary transistor means is a field-effect transistor.

4. The circuit arrangement of claims 1 or 2 wherein said driver transistor means is a field-effect transistor.

5. The circuit arrangement of claims 1 or 2 wherein there is further provided zener diode means connected in shunt across said gate-source path of the power field-effect switching transistor.

6. The circuit arrangement of claims 1 or 2 wherein there is further provided zener diode means connected in shunt across a gate-source path of said auxiliary transistor means.

7. The circuit arrangement of claim 2 wherein said diode is a zener diode.

8. The circuit arrangement of claims 1, 2, or 7 wherein there is further provided resistance means connected in series with a switching path of said auxiliary transistor means.

9. The circuit arrangement of claim 1 wherein there is further provided parallel circuit means having a resistance connected in parallel with a diode, said parallel circuit means being arranged between a switching path of said auxiliary transistor means and the gate terminal of the N-channel type power field-effect switching transistor.

* * * * *